United States Patent [19]

Jaeckle

[11] Patent Number: 4,614,940
[45] Date of Patent: Sep. 30, 1986

[54] MICROPOWER DC VOLTAGE INDICATOR

[75] Inventor: Thomas H. Jaeckle, San Antonio, Tex.

[73] Assignee: Southwest Research Institute, San Antonio, Tex.

[21] Appl. No.: 790,613

[22] Filed: Oct. 21, 1985

[51] Int. Cl.[4] .................. G08B 21/00; G09G 3/18; H03B 5/12
[52] U.S. Cl. .................. 340/636; 331/108 D; 331/DIG. 3; 340/663; 340/765
[58] Field of Search ............... 340/636, 663, 765, 784; 331/108 D, DIG. 3

[56] References Cited

U.S. PATENT DOCUMENTS

| | | | |
|---|---|---|---|
| 3,503,062 | 3/1970 | Witzke et al. | 340/636 |
| 3,550,105 | 12/1970 | DeCola et al. | 340/636 |
| 3,575,492 | 4/1971 | Nester et al. | 340/784 |
| 3,832,629 | 8/1974 | Cernek, Jr. | 340/636 X |
| 4,479,118 | 10/1984 | Cole, Jr. | 340/765 X |

OTHER PUBLICATIONS

Electronic Engineering (Feb. 1982), "Temperature Compensation in CMOS Oscillators", by Ward et al., p. 25.

Primary Examiner—Charles A. Ruehl
Assistant Examiner—Daniel Myer
Attorney, Agent, or Firm—Gunn, Lee & Jackson

[57] ABSTRACT

A micropower DC voltage indicator is provided that is a two terminal device with a very high input impedance. An oscillator circuit is provided by a series of inverters, such as metal-oxide semiconductors (MOS) with the power inputs connected in parallel. A suitable RC circuit connects the output of one MOS inverter to the input of another MOS inverter, otherwise the output of each MOS inverter connects directly to the input of the next MOS inverter. Across one of the MOS inverters is connected a liquid crystal display which indicates if a DC voltage within a specific range is applied to the two terminals of the DC voltage indicator. The two terminal inputs to the oscillator circuit have a very high impedance and operate over a fairly broad DC voltage range.

5 Claims, 2 Drawing Figures

MICROPOWER DC VOLTAGE INDICATOR

BACKGROUND OF THE INVENTION

The present invention relates to a two terminal voltage indicator that will operate over a wide range of DC voltages and, more particularly, to a micropower DC voltage indicator that has a very high input impedance which will, when a voltage is present at the input terminals, drive an oscillator circuit, the oscillator circuit in turn controlling a liquid crystal display which indicates if a voltage is present.

DESCRIPTION OF THE PRIOR ART

In recent years, liquid crystal displays have become very popular because of their low power requirements. One of the most common usages of a liquid crystal display is in watches. A liquid crystal display consists of two separate sheets of glass separated by a sealed-in, normally transparent, liquid crystal material. The outer surface of each glass sheet has a transparent conductive coating, such as tin oxide or indium oxide, with the viewing-side coating being etched into character-forming segments that have leads going to the edge of the display. A voltage applied between front and back electrode coatings disrupts the orderly arrangement of the molecules thereby darkening the liquid enough to form visible characters, even though no light is generated. Basically the molecules are polarized by the voltage being applied to the electrodes.

Very complicated or very simple liquid crystal displays can be designed. Liquid crystal displays may be of the transmissive or reflective type. In the transmissive type upon applying a voltage, the normally opaque liquid becomes transparent and light transmits through it. In the reflective type upon applying a voltage, the transparent liquid crystal becomes opaque and does not let light transmit through it.

In the present invention, the liquid crystal display needs to indicate an ON or OFF condition if a voltage is being applied with something as simple as a dot indicating a voltage is present.

One of the desirable aspects of using a liquid crystal display is that it requires very little power to operate. However, the liquid crystal display must be operated by an alternating voltage. Therefore, to use a liquid crystal display to indicate if a DC voltage is present, some type of high impedance oscillator is required to convert the DC voltage to an AC voltage.

A metal-oxide semiconductor (MOS) device, which has a very high input impedance, can be used to form the oscillator. MOS uses both P-channel and N-channel devices on the same substrate to achieve high noise immunity and low power consumption—less than 1 microwatt per gate and negligble power during standby. In MOS devices, the logic levels swing to within a few milivolts of the supply voltage. The input drive currents required for MOS devices is miniscule. One of the integrated circuits using complementary metal-oxide semiconductor CMOS logic is the 4000B series, which can be powered by voltages up to 18 volts. Other series of MOS devices can also be used. The oscillator could also be implemented with other MOS technologies.

By using an odd number of MOS inverters connected in a series or cascade arrangement, a free running oscillator can be created. By using a resistor/capacitor circuit between the output and input of one of the inverters, the frequency of oscillation can be adjusted as desired by the particular application.

In the design of battery powered portable equipment, it is many times very desirable to have a visual indication to determine if the system or any particular component thereof is at a particular logic state. Previously, transistor-transistor logic (TTL) was used with light emitting diodes (LED); however, these types of devices require too much power for most battery powered portable equipment.

A number of different patents were found during the course of searches by applicant which show various aspects of the present invention; however, none of the patents found show a two terminal micropower voltage indicator device that has a high input impedance with a DC voltage being applied across the terminals driving an oscillator which in turn operates a liquid crystal to give a visual indication if a DC voltage within a specific range is present. Particularly, none of the patents show the use of a cascade arrangement of MOS inverters with an RC circuit connecting between the output and input of one of the inverters for driving a liquid crystal display connected across another inverter. The RC circuit controls the operating frequency of the inverters, which are basically a free running oscillator. Patents found during the course of the search are as follows:

| U.S. PAT. NO. | INVENTOR |
| --- | --- |
| 3,548,254 | Pahlavan |
| 3,774,195 | Schulthess, et al. |
| 3,936,817 | Levy, et al. |
| 4,188,626 | Frantz, et al. |
| 4,019,178 | Hashimoto, et al. |
| 4,070,749 | Misomo, et al. |
| 4,158,786 | Hirasawa |
| 4,425,030 | Schmidt |
| 4,436,436 | Kitano |
| 3,796,951 | Joseph |
| 4,037,931 | Ido, et al. |
| 4,233,603 | Castleberry |
| 4,298,866 | Hodemakers |
| 4,271,408 | Teshima, et al. |
| 4,403,217 | Becker, et al. |
| 3,739,200 | D'Agostino |
| 3,842,411 | Naito |

SUMMARY OF THE INVENTION

It is an object of the present invention to provide a micropower DC voltage indicator.

It is a further object of the present invention to provide a micropower DC voltage indicator that has a very high input impedance, which indicator is economical to build and may be installed in portable battery operated equipment.

It is yet another object of the present invention to provide a diagnostic aid of battery powered portable equipment to indicate the logic state of the equipment with a permanently installed micropower DC voltage indicator at various points throughout the equipment.

The micropower DC voltage indicator has a single pair of input terminals which connect to an oscillator circuit that has a very high input impedance. The oscillator circuit may include an odd number of inverters connected in series or cascade arrangement with the power inputs being connected in parallel to the input terminals. An RC circuit connected between the input and output of one of the inverters controls the oscillating frequency. A liquid crystal display is connected across another inverter so that the liquid crystal display is energized when a DC voltage is applied to the input terminals over a certain predetermined range. The inverters have a very high input impedance as is common with metal-oxide semiconductors (MOS) when connected in a cascade arrangement. The liquid crystal display may be of the transmissive or reflective type.

By using a cascade arrangement of MOS inverters with an RC circuit connected across one inverter determining the cycle rate, a free running oscillator is created. The power connection to the inverters would be the voltage source an individual wanted to measure. If a DC voltage is present between 3 and 18 volts, the free running multivibrator would oscillate. By connecting a liquid crystal display across one of the inverters, the liquid crystal display would give a visual indication if a voltage in the specified range is present. This basically would indicate a logic state for the item being measured.

A series of micropower DC voltage indicators could be located throughout the circuit to indicate conditions of various states of the circuit, even in portable battery operated circuits. This would allow for diagnostic checking in the field and possible field repair of the device using the micropower DC voltage indicator as described hereinbelow.

The only measurable drain on the circuit is when the inverters switch to oscillate. Therefore, it is desirable that the oscillation be as low as possible, yet still provide what appears to be a continuous ON indication for the liquid crystal display if a voltage is being applied to the single pair of input terminals. Therefore, the RC circuit should be sized to provide approximately a 100 hertz cycle rate for the oscillator.

DESCRIPTION OF THE PREFERRED EMBODIMENT

For battery operated equipment, it is extremely important that all items have the lowest possible power dissipation. Also in battery operated equipment, it is many times important to know the state of various logic functions. For example, if visual indications are included throughout a circuit that would indicate the state of various logic functions, a visual diagnostic check can be internally provided in the equipment. For any permanently installed diagnostic check that would give a visual indication of voltage levels, it is essential that the indicator draw the absolute minimum voltage possible. Otherwise a plurality of voltage indicators would soon drain down the battery supply voltage.

In portable battery powered field equipment, such as commonly used by the military, it would be very useful if the equipment could be repaired in the field. By inclusion of micropower DC voltage indicators in various locations throughout the equipment, the operator of the equipment many times would be able to repair the equipment for further use in the field.

By use of liquid crystal displays in combination with a high input impedance oscillator that operates over a wide range of DC voltages, such a micropower DC voltage indicator is possible as is further explained in this invention. A high impedance oscillator can be constructed from a series or cascade arrangement of inverters that are of the metal-oxide semiconductor (MOS) type. MOS inverters have a very high input impedance at their power inputs. One type of MOS inverter is the complementary metal-oxide semiconductor (CMOS) inverter.

Figure 1:
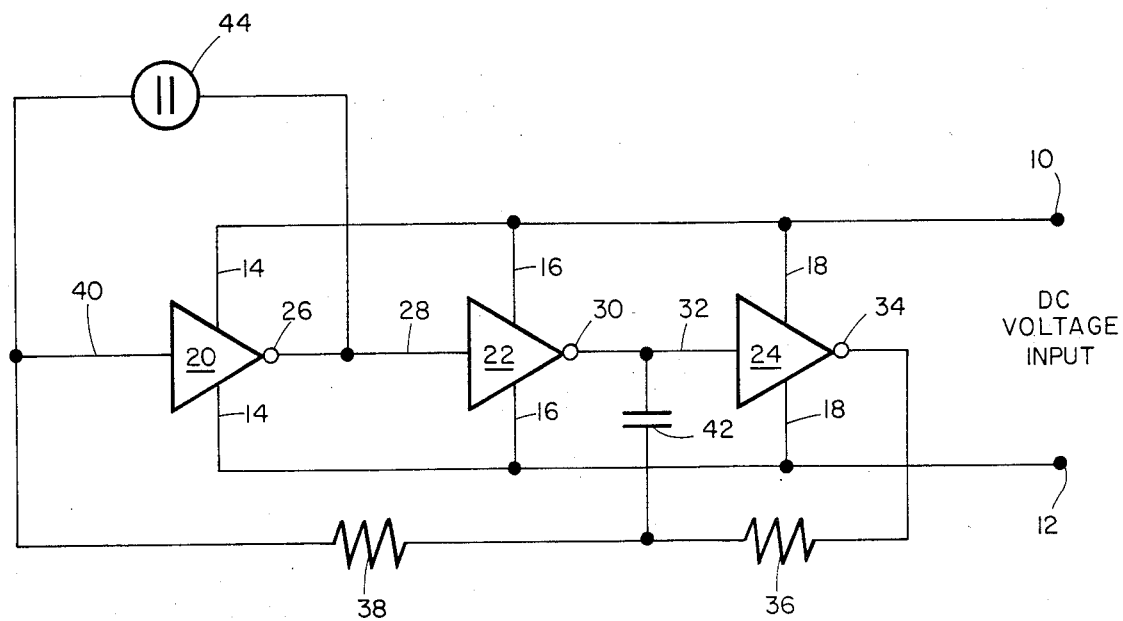
FIG. 1 is a schematic diagram of a micropower DC voltage indicator made in accordance with the present invention.

Referring to FIG. 1, a two terminal device for measuring a DC voltage is provided. Input terminals 10 and 12 are connected to a suspected DC voltage input. Through the input terminals 10 and 12, the DC voltage input is connected to the power terminals 14, 16 and 18 of MOS inverters 20, 22 and 24, respectively. The output 26 of MOS inverter 20 is connected to the input 28 of MOS inverter 22, the output 30 of MOS inverter 22 is connected to the input 32 of MOS inverter 24, and the output 34 of MOS inverter 22 is connected through series resistors 36 and 38 to the input 40 of MOS inverter 20. Connected between the series resistors 36 and 38 is one end of a capacitor 42 which connects on the opposite end between the output 30 of MOS inverter 22 and input 32 of MOS inverter 24.

This type of arrangement for the MOS inverters 20, 22 and 24 is sometimes referred to as a series or a cascade arrangement. Connected across MOS inverter 22 is a liquid crystal display 44.

Figure 2:
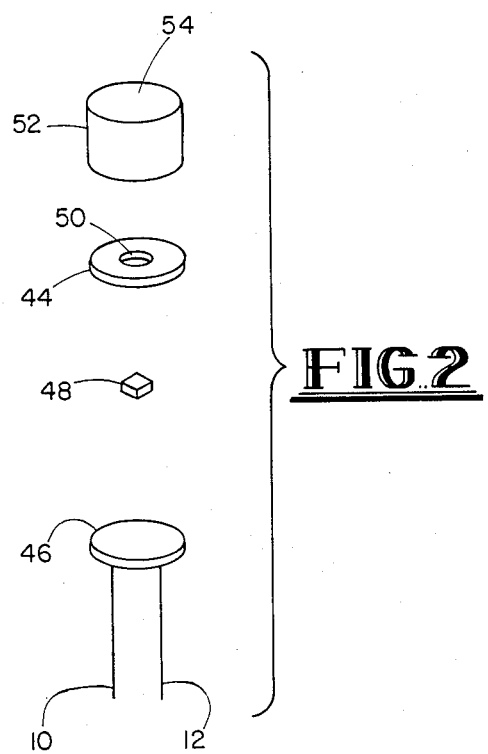
FIG. 2 is an enlarged exploded perspective assembly view of a micropower DC voltage indicator.

The micropower DC voltage indicator as described in connection with FIG. 1 can be packaged as a very small device and installed at various points throughout a logic circuit. For example, FIG. 2 shows an enlarged version of how the micropower DC voltage indicator of FIG. 1 could be packaged. The input terminals 10 and 12 would be connected through a supporting base 46 to a MOS logic chip 48. The MOS logic chip 48 contains internally the MOS inverters 20, 22 and 24. Also the MOS logic chip 48 could be made to include series resistors 36 and 38 and capacitor 42.

Connected to the MOS logic chip 48 and located immediately thereabove is the liquid crystal display 44. The liquid crystal display 44 has a single dot 50 located in the center thereof, which dot 50 will indicate if a voltage is or is not present at the input terminals 10 and 12. For example, the dot 50 of the liquid crystal display will either allow light to be transmitted therethrough depending upon whether or not a voltage is present at the input terminals 10 and 12.

Encapsulating the MOS logic chip 48 and the liquid crystal display 44 is a header 52. Header 52 has a transparent top 54 to allow an individual to view the dot 50 of the liquid crystal display 44. The header 52 is mounted on the base 46 and protects the MOS logic chip 48 and liquid crystal display 44.

It should be realized that FIG. 2 is an enlarged version of one possible construction of a micropower DC voltage indicator. The micropower DC voltage indicator could be installed throughout a digital logic circuit to indicate whether or not a voltage is present at various logic points. By the use of a number of micropower DC voltage indicators such as illustrated in FIGS. 1 and 2, a visual self-diagnostic check can be provided internally within the equipment which would aid in determining if the equipment is operating properly. This is particularly important for battery powered equipment where the voltge drain must be kept to a minimum.

On measuring the input impedance at input terminals 10 and 12, the input impedance is very high. In fact, the input impedance is so high that the MOS inverters could be connected in parallel by the thousands and still not have a significant effect as far as power drain. Typical examples of the types of MOS inverters would be an RCA CD4029, Series Level UB, or Motorola MC 14049 UB. For these types of MOS inverters, the input voltage could vary at input terminals 10 and 12 between three and eighteen volts with the micropower DC voltage indicator operating properly. Most digital logic is designed for approximately twelve volts, so the range of three to eighteen volts becomes ideal.

The MOS inverters 20, 22, and 24 will generate a square wave that is within 99% of the input voltage felt on input terminals 10 and 12. Also the current consumption of the MOS inverters 20, 22, and 24 is almost zero when it is the steady state condition. The only measurable power consumption is at the time of switching. While the MOS inverters 20, 22, and 24 will operate in the megahertz range, the power consumption can be reduced by reducing the switching frequency. As a trade-off, 100 hertz cycling rate for the MOS inverters 20, 22, and 24 is recommended because any flicker that may occur in the liquid crystal display 44 cannot be seen by the naked eye. It would appear as if the liquid crystal display 44 is continuously ON or OFF as indicated by the condition of the dot 50. The liquid crystal display 44 can be of either the transmissive or reflective type, whichever is desired.

The cycle rate of the oscillator formed by MOS inverters 20, 22, and 24 is determined by series resistors 36 and 38 and capacitor 42, which form an RC network. By use of series resistors 36 and 38 in the hundred thousand ohm range and the capacitor 42 in the 0.1 microfared range, approximately 100 hertz cycle rate can be obtained. It should be realized that the cycle rate can be varied greatly with 100 hertz being selected as the optimum range for minimum power consumption, yet good visual indication.

While FIG. 2 is intended to be a pictorial illustration of how the micropower DC voltage indicator can be assembled, it should be realized that the dimensions could be extremely small. For example, the micropower DC voltage indicator could be packaged as a square no more than 0.1 inches on each side. The problem would be making the micropower DC voltage indicator large enough so that the visual indication given by the liquid crystal display 44 is clearly distinguishable. The only requirement is that no DC voltage component be applied to the liquid crystal display 44 because it would destroy the readout provided by dot 50. That is the reason why the liquid crystal display 44 is connected across inverter 20 so that no DC component would be present.

By construction of a micropower DC voltage indicator as described hereinabove, it could be permanently installed in the equipment as a self-diagnostic tool used at the time of repair. There would be almost no penalty for the inclusion of micropower DC voltage indicators as far as power drain on the system is concerned.

The micropower DC voltage indicator is very voltage tolerant having a range between three and eighteen volts. The two terminal device has a very high input impedance with an oscillator circuit driving the liquid crystal display 44 to indicate if a voltage is present. The beauty of the present invention is in the simplicity of design and economic cost of the invention.

I claim:

1. A micropower DC voltage indicator for measuring a wide range of DC voltages and giving a visual indication if a DC voltage is present, said voltage indicator drawing minute amounts of power which is important for battery operated equipment, said voltage indicator comprising:
    a single pair of terminals for connection to a source of said DC voltage;
    oscillator means connected to said DC voltage through said single pair of terminals for oscillating if said DC voltages within said wide range is present, said oscillator means having a very high input impedance; and
    a liquid crystal display driven by said oscillator means, said liquid crystal display giving said visual indication if said DC voltages within said wide range are present at said single pair of terminals and no visual indication if said DC voltages within said wide range are not present at said single pair of terminals.

2. The micropower DC voltage indicator for measuring a wide range of DC voltages as given in claim 1 wherein said oscillator means includes an odd number of metal-oxide semiconductors (MOS) inverters with said single pair of terminals connecting to power terminals of said inverters, an RC circuit connecting between an input and output of one of said inverters, said liquid crystal display being connected across at least one of said inverters.

3. The micropower DC voltage indicator for measuring a wide range of DC voltages at given in claim 2 wherein said MOS inverters are three in number with said power terminals thereto being connected in parallel across said single pair of terminals, said output of each said inverter being connected to said input of another of said inverters for a series connection, said RC circuit being across only one of said inverters, said liquid crystal display being connected across only one of said inverters.

4. A micropower DC voltage indicator adapted for use with battery powered equipment and having a very high input impedance, said micropower DC voltage indicator giving a visual indication if a DC voltage is present at a given location, said indicator comprising:
    a single pair of terminals for connecting to said given location;
    at least three metal-oxide semiconductor (MOS) inverters being connected in a cascade arrangement, power terminals of said MOS inverters being connected in parallel across said single pair of terminals, said MOS inverters operating as a free running oscillator generating alternating square waves at each input and output of each said MOS inverter;
    an RC circuit formed by a resistor/capacitor network between said input and said output of one of said MOS inverters, said RC circuit determining frequency of said alternating square waves; and
    a liquid crystal display connected across said input and said output of one of said MOS inverters, said liquid crystal display giving a visual indication if a DC voltage within a certain voltage range is present at said given location.

5. The micropower DC voltage indicator as recited in claim 4 further includes said MOS inverters being formed on a single semiconductor chip, said semiconductor chip and said liquid crystal display being mounted in a single header with a transparent top therein for said visual indication therethrough.

* * * * *